(12) United States Patent
Sharma et al.

(10) Patent No.: US 9,419,592 B2
(45) Date of Patent: Aug. 16, 2016

(54) VARIABILITY RESISTANT CIRCUIT ELEMENT AND SIGNAL PROCESSING METHOD

(71) Applicant: NXP B.V., Eindhoven (NL)

(72) Inventors: Vibhu Sharma, Eindhoven (NL); Jose de Jesus Pineda De Gyvez, Eindhoven (NL)

(73) Assignee: NXP B.V., Eindhoven (NL)

( * ) Notice: Subject to any disclaimer, the term of this patent is extended or adjusted under 35 U.S.C. 154(b) by 161 days.

(21) Appl. No.: 14/478,851

(22) Filed: Sep. 5, 2014

(65) Prior Publication Data

US 2015/0091627 A1    Apr. 2, 2015

(30) Foreign Application Priority Data

Sep. 30, 2013    (EP) .................................... 13186690

(51) Int. Cl.
*H03K 3/00* (2006.01)
*H03K 3/037* (2006.01)
*H03K 3/356* (2006.01)

(52) U.S. Cl.
CPC ............ *H03K 3/0372* (2013.01); *H03K 3/0375* (2013.01); *H03K 3/356121* (2013.01); *H03K 3/356139* (2013.01); *H03K 3/356156* (2013.01)

(58) Field of Classification Search
None
See application file for complete search history.

(56) References Cited

U.S. PATENT DOCUMENTS

| | | | | |
|---|---|---|---|---|
| 5,233,617 A * | 8/1993 | Simmons | ............ | H03K 3/0375 326/94 |
| 8,018,271 B2 | 9/2011 | Shimura | | |
| 8,185,786 B2 | 5/2012 | Flautner et al. | | |
| 8,412,996 B2 * | 4/2013 | Bancel | ............ | G06K 19/07363 714/55 |
| 8,659,336 B2 * | 2/2014 | Kulmala | ............ | H03L 7/00 327/142 |
| 8,837,657 B1 * | 9/2014 | Amourah | ............ | H04L 7/033 375/340 |
| 2004/0264615 A1 * | 12/2004 | Ho | ............ | G01R 31/31711 375/355 |
| 2006/0227912 A1 * | 10/2006 | Leibowitz | ........ | G01R 31/31709 375/350 |
| 2007/0168848 A1 | 7/2007 | Tschanz et al. | | |
| 2007/0230614 A1 * | 10/2007 | Walker | ............... | G06F 13/4295 375/296 |
| 2007/0266282 A1 | 11/2007 | Chakraborty et al. | | |
| 2009/0024888 A1 * | 1/2009 | Kurimoto | ......... | G01R 31/31858 714/731 |
| 2010/0039135 A1 | 2/2010 | Miyazaki | | |
| 2010/0162058 A1 | 6/2010 | Turner et al. | | |
| 2011/0302460 A1 | 12/2011 | Idgunji et al. | | |
| 2012/0044024 A1 * | 2/2012 | Wagner | ................ | H03K 3/0315 331/57 |
| 2012/0074982 A1 | 3/2012 | Rebaud et al. | | |
| 2015/0091607 A1 * | 4/2015 | Priel | ................ | H03K 19/00369 326/9 |
| 2015/0331044 A1 * | 11/2015 | Jajodia | ............... | G01R 31/3177 714/727 |

OTHER PUBLICATIONS

Srinivasan, Viji. et al; "Optimizing pipelines for power and performance"; Proc. Intl. Symp. Microarchitecture (MICRO-35), pp. 333-334 (Nov. 2002).
Hartstein, A., et al; "The Optimum Pipeline Depth Considering Both Power and Performance"; ACM Transactions on Architecture and Code Optimization, vol. 1, No. 4; pp. 369-288 (Dec. 2004).
Extended European Search Report for application No. 13186690.7 (Mar. 24, 2014).

* cited by examiner

*Primary Examiner* — Tuan T Lam (57) ABSTRACT

A sequential circuit arrangement and method are provided in which a latch input signal and a latched version of the input signal are compared to derive a difference signal. This difference signal can detect when changes in the input are not propagated to the output. A second logic gate arrangement derives an error signal from the product of difference signal and a delayed version of the difference signal. This means that normal operation of the circuit is not detected as an error—only when the latched output fails to follow the input after the normally expected delay is the error signal created. The latch element output or an inverted version of the latch element output is selected in dependence on the error signal.

15 Claims, 7 Drawing Sheets

VARIABILITY RESISTANT CIRCUIT ELEMENT AND SIGNAL PROCESSING METHOD

CROSS-REFERENCE TO RELATED APPLICATIONS

This application claims the priority under 35 U.S.C. §119 of European patent application no. 13186690.7, filed on Sep. 30, 2013, the contents of which are incorporated by reference herein.

FIELD OF THE INVENTION

This invention relates to circuit elements that are resilient to process variation and to method of processing signals to provide variability resilience.

BACKGROUND OF THE INVENTION

Technology scaling has caused an enormous increase in timing variations, making it difficult to predict the cycle time of microprocessors. The cycle time is determined by the target performance with an added timing margin, necessary for an acceptable yield. The sensitivity of cycle time to variations is a major bottleneck in achieving the maximum performance and for meeting power specifications of applications with energy constraints.

The variations are classified into two categories; static variations like process variation and dynamic variations.

The examples of dynamic variations are supply voltage variations, temperature variations, radiation effects like single event upset (SEU) errors and ageing effect such as Negative Bias Temperature Instability (NBTI). The dynamic variations can also be workload dependent. For example, abrupt changes in the switching patterns can cause large transients current in the power mesh system and results in VDD drop on certain die locations.

The traditional worst case corner analysis based methodology for the determination of cycle time is overly pessimistic. In this approach, the impact of variations is compensated by the addition of an individual safety margin for each source of variability on the top of the nominal case requirements. For example, a traditional approach utilizes worst case supply voltage and frequency to overcome the impact of variations. Therefore, the added design margin represents an overly pessimistic very high total safety margin, which in turn results in chips failing the power specification.

The resultant die area with the traditional worst case design approach increases and also its capability to deal with dynamic variations is limited.

Post silicon tuning methods like VDD supply and body biasing are used to deal with static process variations. However, the effectiveness of these techniques is limited to deal with dynamic variations. A control signal based feedback loop mechanism, for tracking the operating conditions and then adaptively adjusting the supply voltage or body bias voltage, is a superior technique compared to the pessimistic worst-case corner based methodology. Another advantage with the adaptive VDD control mechanism is the ability to compensate for the delay degradation caused by the aging effects like electro migration and NBTI.

This pessimism built into the conventional approach can be reduced by designing the circuit with timing closure at the nominal corner and then always operating at the edge of failure by using error detection sequential logic.

Error detection sequential (EDS) circuits are utilized for preventing the errors (as is the case for "Canary flip flops" discussed below) or resorting to replaying the operation with an enhanced operating margin on the detection of timing errors (as is the case for "Razor flip flops" discussed below). However, the usage of existing EDS circuits requires a feedback mechanism for tuning the supply lines or body bias voltages in case of Canary FFs and pipeline flushing, architecture replay or cycle stalling for Razor FFs.

This complicates the design effort, thereby making it less attractive for the low cost system on chip applications.

Canary flip flops have a self-adjusting control mechanism. The detection of a warning signal adjusts the canary flip flop setting such as supply voltage or body bias voltage for the next clock cycles. The canary flip flop technique can only predict the occurrence of timing errors but cannot guarantee the complete elimination. The tuneable delay lines (setting the value of delay depending on the operating condition) used in Canary flips flops rely on an energy-intensive feedback mechanism. The ability to deal with an abrupt workload dependent fluctuation is also limited these FFs.

The razor flip flop mechanism, contrary to the Canary flip flop, detects and corrects the timing errors in the combinational path. The Razor FF computes an error signal by comparison of the sampled outputs of two flip flops. It is based on the assumption that the second flip flop is infallible and more robust compared to the first flip flop. The varying degree and nature of impact of VT mismatches, soft event upsets (SEU) error and ageing effects like NBTI on these two flip flops make this assumption precarious.

Razor FFs require the timing window just after the rising clock edge in order to detect a late arriving signal and flag it as a timing error. Then it resorts to re-execution mechanism or pipeline flushing to correct timing errors. The re-execution is performed through architecture replay. In this way, existing Razor FFs first detect the error and then in next cycle the errors are resolved by relying on architecture replay in next cycles or clock stalling for the consecutive FFS, as the case with the bubble razor.

This approach is more suitable for high-performance processors to support branch prediction. The timing errors are dealt with in a similar manner, such as by speculative execution. The timing error can be corrected by flushing the processing pipeline stages and reexecution from the last check point. However, this is impractical for general sequential circuits, real time processors for energy limited applications. The re-execution of instruction or architecture replay not only increases the power consumption but also impacts the processing throughput by increasing the instruction per cycle count. This results in fluctuation of computational latency that can be difficult to tolerate in many real time signal processing applications.

There remains a need for an error correction sequential element for critical combinational paths which can detect and correct timing errors without resorting to expensive feedback control mechanism as required by Canary flip flops or increased cycles per instruction count as used by Razor flip flops.

SUMMARY OF THE INVENTION

According to the invention, there is provided a circuit arrangement and method as defined in the independent claims.

One aspect provides a sequential circuit arrangement, comprising:

a latch element clocked by a clock input signal;

a first logic gate arrangement for comparing a latch input signal and a latched version of the input signal to derive a difference signal;

a second logic gate arrangement for deriving an error signal from the difference signal and a delayed version of the difference signal; and a selection unit for selecting the latch element output or an inverted version of the latch element output in dependence on the error signal.

This circuit arrangement provides self-correcting variability tolerance. The circuit can adapt to the process variations and eliminate the usage of pessimistic design margins.

The circuit exploits signal correlation information between the input data and the sampled output data, in order to detect erroneous samples. This is an improved approach compared to the known comparison of the sampled outputs of two flip flops which relies on the infallibility of the second flip flop (or latch). In particular, the impact of threshold voltage mismatches, soft event upset (SEU) errors and ageing effects like negative bias temperature instability (NBTI) on these two flip flops can be of different magnitude.

The correction mechanism used in the circuit of the invention is based on an internal feedback signal (the use of a delay element effectively provides a feedback architecture) and this feedback enables self-correcting without re-executing the combinational path. Thus, there is no need for architecture replay as on the detection of timing error, error correction can happen in the same cycle.

There is no requirement for any closed loop external feedback mechanism at the chip level and also it does not cause any instruction per cycle penalty. There is no need for VDD tuning or the control of bias voltages for error correction.

The invention thus avoids the need for increased guard bands on the timing margins to account for static and dynamic variations. These result in excessive power consumption and result in an increased area overhead.

The selection unit preferably has a latch mode in which it holds its output at the value at the beginning of the latch mode, the latch mode being timed based on the high or low phase of the clock input signal. The timing of the latch mode can be based on a delayed version of one of the phases of the clock input signal. For example, during a period of time which is a delayed version of the high phase of the clock input signal, the latch mode is active so that the multiplexer output does not change. At the end of the latch mode (based on the low clock phase), the normal selection function based on the error signal resumes.

The latch element can comprise a flip flop, such as a D-type flip flop.

Preferably, there is provided a clocked delay element for providing the delayed version of the difference signal. The clocked delay element has a delay representing the path delay through the latch element and through the first logic gate arrangement. In this way, the delay element propagates the previous different signal value. For this purpose, the delay element is preferably clocked with first and second clock signals provided by the latch element, one in phase with the clock input signal and the other 180 degrees out of phase with the clock input signal. Alternatively, the clock signals could be generated internally within the delay element from the same input clock used by the latch element.

In the same way as for the selection unit, the delay element can have the same latch mode in which it holds its output at the output value at the beginning of the latch mode, the latch mode being timed based on the high or low phase of the clock input signal.

The selection unit preferably comprises a multiplexer with a clocked output buffer. This output buffer stabilizes the output. The multiplexer is preferably also clocked with first and second clock signals provided by the latch element, one in phase with the clock input signal and the other 180 degrees out of phase with the clock input signal.

The invention also provides a method of processing an input signal within a sequential circuit arrangement, the method comprising:

latching the input signal timed with a clock input signal;

comparing the input signal and the latched version of the input signal to derive a difference signal;

generating a delayed version of the difference signal;

deriving an error signal from the difference signal and the delayed version of the difference signal;

selecting the latch element output or an inverted version of the latch element output in dependence on the error signal.

This method essentially detects an error in the latch output and carries out a data inversion when an error is detected.

BRIEF DESCRIPTION OF THE DRAWINGS

Examples of the invention will now be described in detail with reference to the accompanying drawings, in which.

DETAILED DESCRIPTION

The invention provides a sequential circuit arrangement and method in which a latch input signal and a latched version of the input signal are compared to derive a difference signal. This difference signal can detect when changes in the input are not propagated to the output. A second logic gate arrangement derives an error signal from the difference signal and a delayed version of the difference signal. This means that normal operation of the circuit is not detected as an error—only when the latched output fails to follow the input after the normally expected delay is the error signal created. The latch element output or an inverted version of the latch element output is selected in dependence on the error signal.

Figure 1:
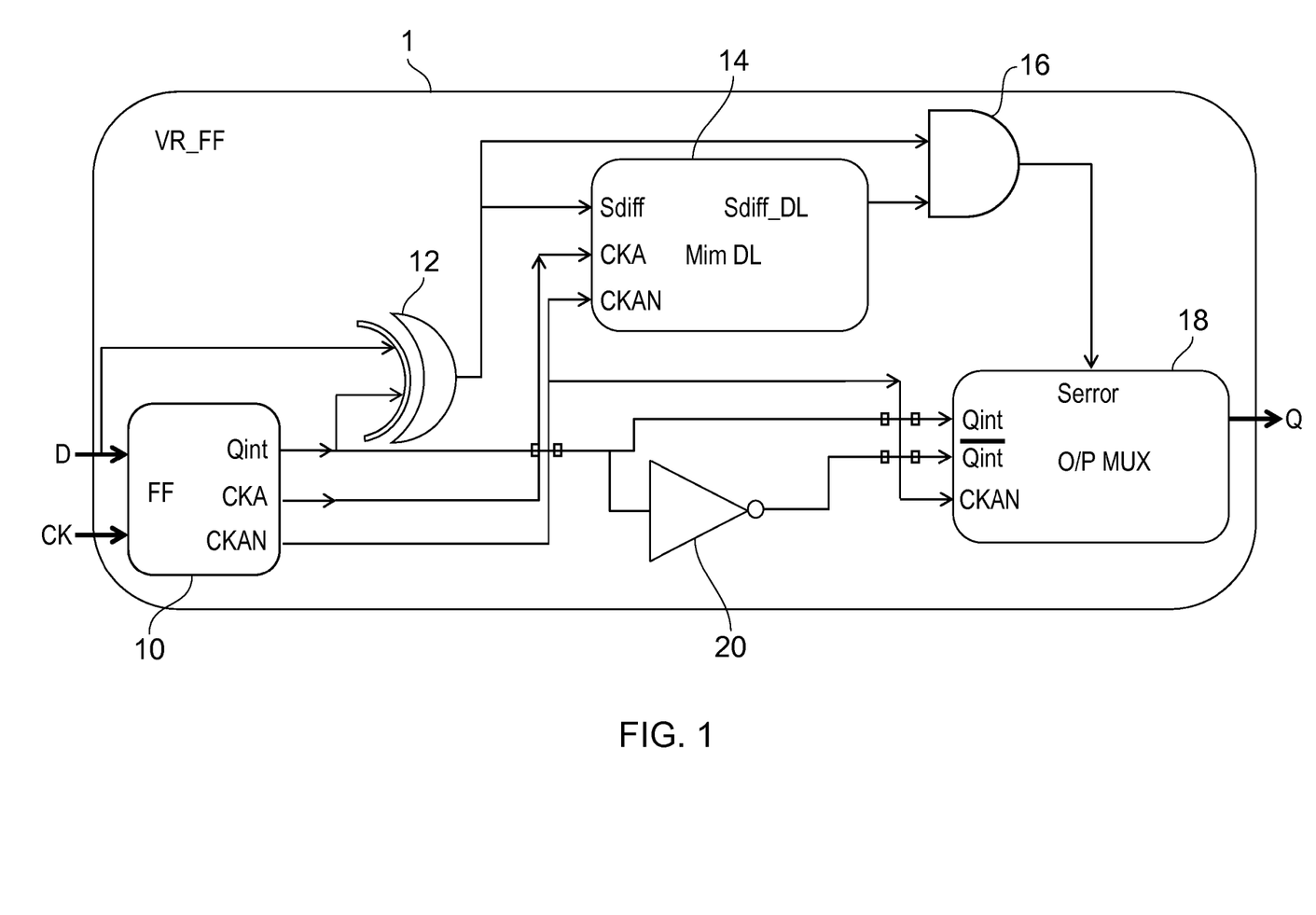
FIG. 1 shows a circuit arrangement in accordance with one example of the invention.

FIG. 1 shows a circuit arrangement in accordance with one example of the invention.

The circuit is a sequential circuit 1, comprising a latch element 10 clocked by a clock input signal CK. It can be a regular flip flop which samples input data on the rising edge of the clock, in the case of a positive edge triggered device. A D-type flip flop is shown. The invention can be implemented with other types of latch, and they can be positive or negative edge triggered.

The flip flop 10 has an input D applied to it, and generates a latched output Qint (internal Q value).

A first logic gate arrangement 12 performs a comparator function for comparing the latch input signal D and the latched version Qint of the input signal to derive a difference signal Sdiff. In this way, correlation between the input data D and the sampled output data Qint of the flip flop is obtained. The logic gate in this example is an XOR gate.

A delay element 14 is used to replicate the regular flip flop and XOR gate delay. In this way shift the signal correlation information Sdiff in the time domain. The delay element is clocked and has a delay representing the path delay (following the clock signal transition) through the flip flop and through the XOR gate. It can be considered to be mimicking delay line (hence the abbreviation "Mim DL").

The clocking of the delay line is such that the delay line is transparent to the SDIFF signal only during the high phase of the clock. During the low phase of the clock the delay line holds the Sdiff signal sampled in the previous high phase of the clock.

A second logic gate arrangement 16 derives an error signal Serror from the difference signal Sdiff and the delayed version Sdiff_DL of the difference signal. This performs timing error determination (based on an AND operation) between the shifted signal correlation Sdiff_DL and the latest signal correlation signal Sdiff after the clock sampling.

A selection unit 18 (shown in the form of an output multiplexer "O/P MUX") is provided for selecting the latch element output Qint or an inverted version of the latch element output in dependence on the error signal Serr. An inverter 20 is provided for this purpose, and the selection unit thus comprises a 2:1 multiplexer.

The output of the multiplexer is the output signal Q, and is equal to the sampled output or inverted sampled output of the flip flop depending on the Serror signal.

This structure implements an internal feedback mechanism for error correction.

The structure makes use of internal clocks from the flip flop. This is so that only the flip flop is clocked by the main clock signal CK so that the clock pin load is kept low.

Figure 2:
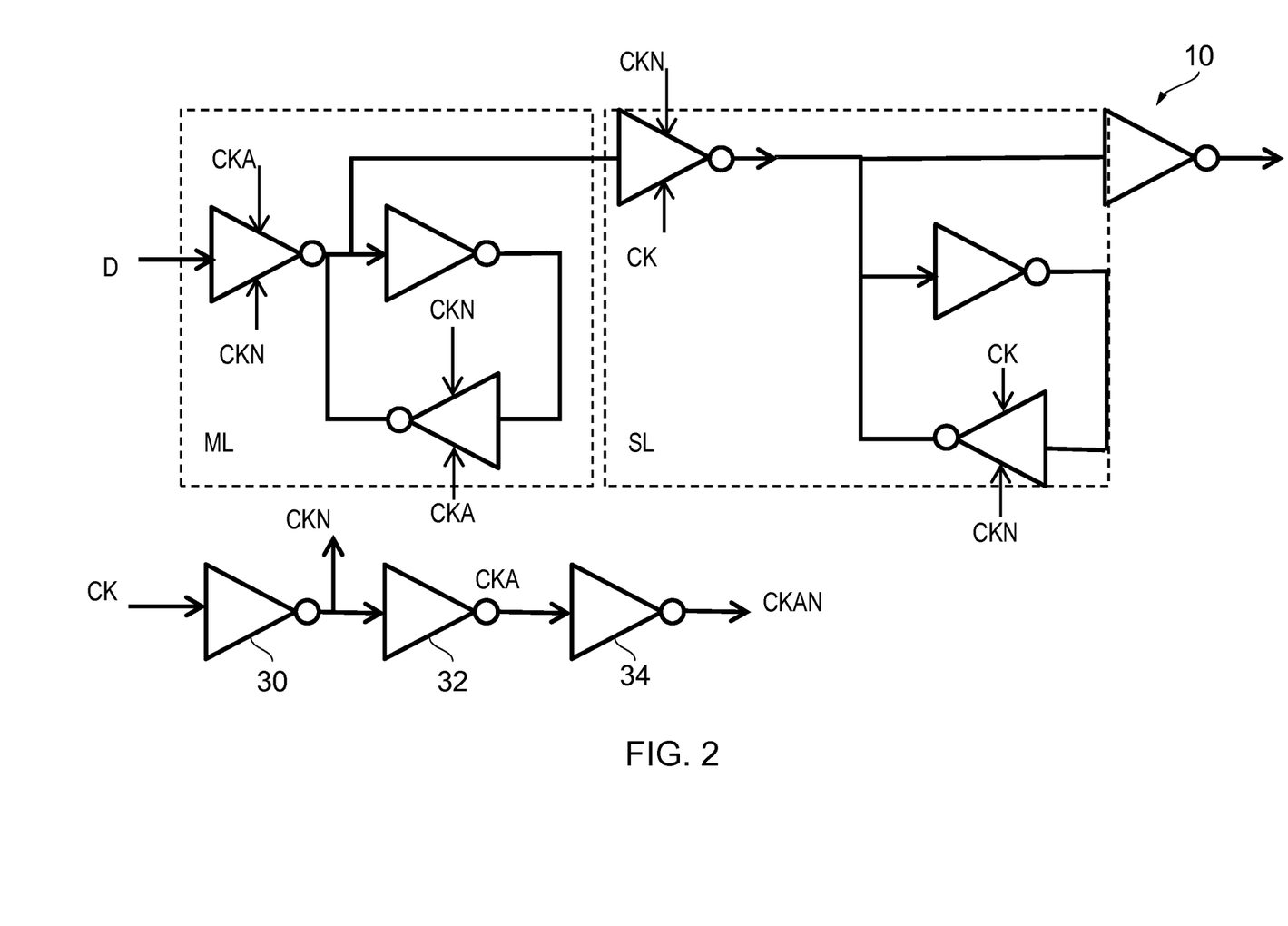
FIG. 2 shows the internal structure of the flip flop in schematic form to show how the internal clock signals are used.

FIG. 2 shows the internal structure of the flip flop 10 in schematic form to show how the internal clock signals are used. The flip flop has a master slave structure (ML,SL) which makes use of internal clock signals. As shown, the global input clock CK is processed using inverters 30, 32, 34 to generate a 180 degree out of phase clock signal CKN, an in-phase clock signal CKA and a further 180 degree out-of-phase clock signal CKAN. These internal clock signals are used to control the switching of the delay line 14 and the multiplexer 18 as shown in FIG. 1.

Figure 3:
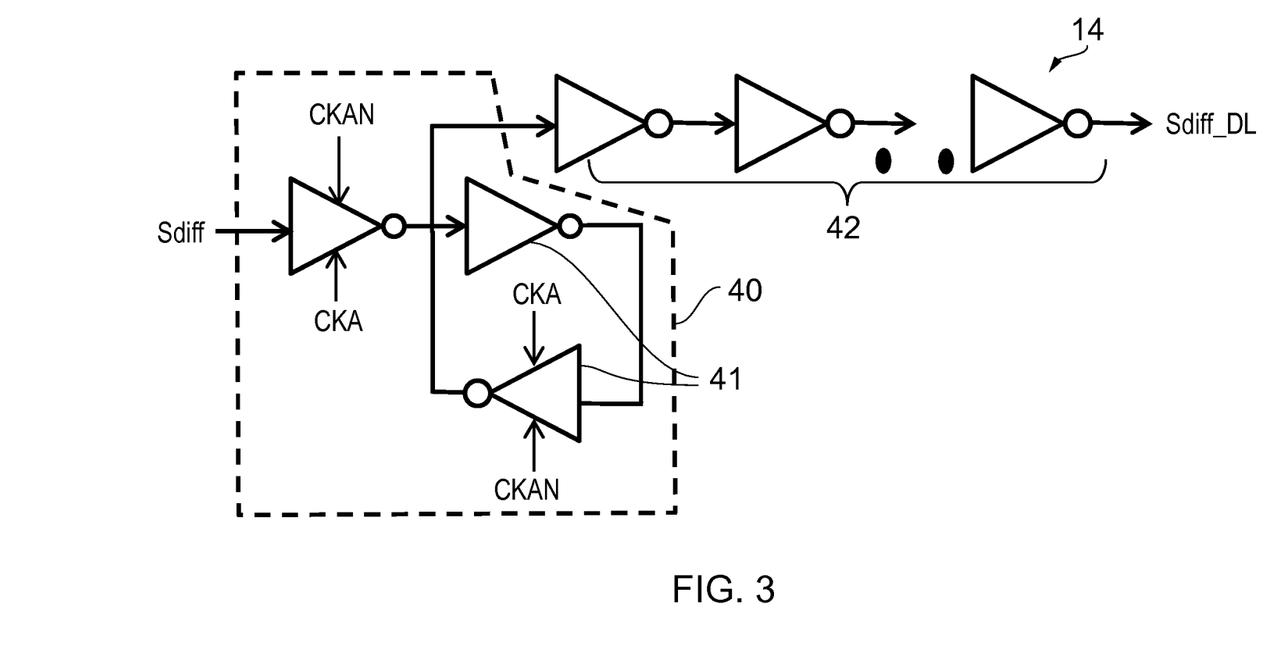
FIG. 3 shows the delay line in more detail.

FIG. 3 shows the delay line 14 in more detail. A first circuit arrangement 40 replicates the delay between the rising edge of the clock signal CK at the change in the latch output signal Qint.

The circuit includes some inverters clocked by a pair of complementary clock signals. This clocking means that the inverter has an operation (transparent) mode during one of the clock phases in which it functions as an inverting buffer, and it has a disabled mode in the other one of the clock phases in which it is deactivated and functions as an open circuit with a floating output.

During the clock low phase, the delay line holds the Sdiff signal sampled in the previous high phase of the clock. The Sdiff value is held by the cross coupled pair of inverters 41.

In a transparent mode, with CKAN low and CKA high so in phase with the high CK phase, the Sdiff signal is inverted and supplied to the inverter chain 42. The lower inverter of the cross coupled pair 41 is disabled so the cross coupled pair performs no function. The signal Sdiff_DL follows the Sdiff signal with a delay. In a latch mode, with CKAN high and CKA low so in phase with the low CK phase, the first inverter is turned off, so isolating the input Sdiff from the delay chain 42. The cross coupled pair of inverters 41 retain the previous inverted Sdiff value so that the Sdiff_DL signal is kept constant.

The back to back inverters are thus functional during the low phase of the clock (i.e. when CKAN is high) otherwise during the high phase of the clock (when CKA is high) the bottom clocked inverter is switched OFF.

Figure 4:
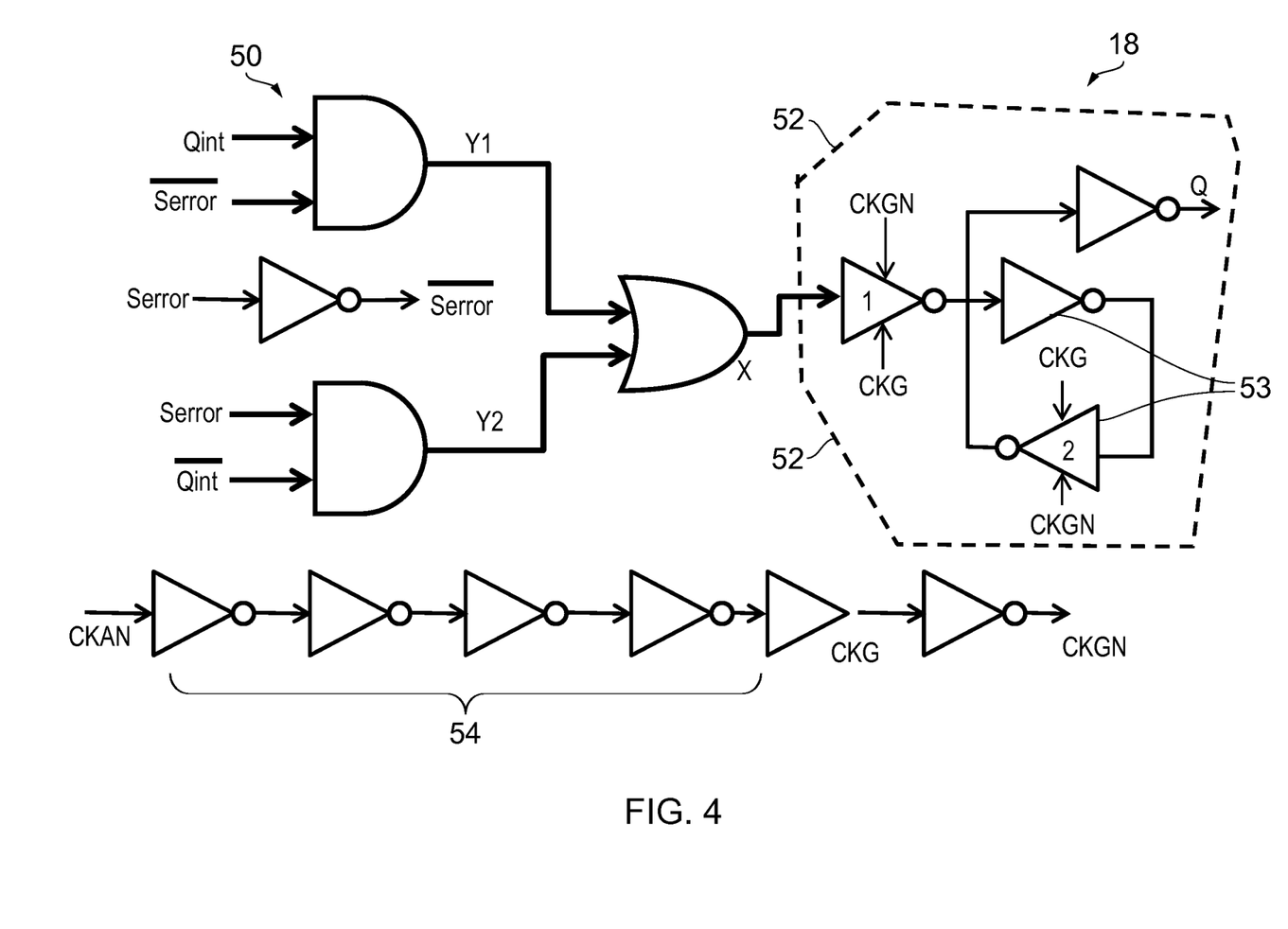
FIG. 4 shows the multiplexer in more detail.

FIG. 4 shows the multiplexer in more detail. It has a selection part 50 and an output latch part 52.

The selection part 50 comprises a logic gate arrangement which generates a signal X which is equal to Qint when Serror is low, and equal to the inverse of Qint when Serror is high. As shown, this logic gate arrangement can be implemented as a pair of AND gates, which feed an OR gate.

The latch part 52 stabilizes the output. As for the delay circuit, it has a back-to-back inverter pair 53 which holds the output to the value of X of the preceding high clock phase, during the low phase of the clock. As shown, it is clocked using further clock signals CKG, CKGN. CKG and CKGN have same phase as CKA and CKAN and are generated by a string of inverters 54. The number of inverters in the string 54 delays the clocking and avoids any glitches at the output X due to history effects.

The circuit operates by extracting the signal correlation (Sdiff) between the input data (which is the for example, current data output of the combinational logic) and the data sampled latch output in the previous clock phase.

This extracted data correlation information is shifted by amount at least equal to the clock to output delay time of the flip flop and the propagation delay of the XOR gate in the time domain.

The correlation information is updated after the rising edge of clock, as the new data is sampled. The shifting process carried out by the delay is active during the entire high phase of clock, and is defined as a "shifting window".

The sampling error (Serror) is determined from the product of the correlation information Sdiff and the time domain shifted correlation information Sdiff_DL. The actual output value is then determined from the Serror signal. The sampled data value is taken as an actual output if there is no sampling error and otherwise the inverted sampled data value becomes the actual output.

The shifting window is defined by the high phase of clock (the period of time after the rising clock edge).

During the shifting window period, during the high phase of the clock CK, the delay element passes the Sdiff information.

Thus, in the transparent mode, in phase with (or slightly delayed with respect to) the high CK phase, the multiplexer output follows the desired input which depends on the value of Serror. The first inverter (number 1) in the latch part 52 is active and the correct output as determined by the Serror signal becomes available as the real output Q. During this transparent phase, the Sdiff difference signal is delayed by the delay chain. The multiplexer functions as a non-inverting buffer to the desired input signal. The lower inverter (number 2) of the cross coupled pair 53 is disabled so the cross coupled pair performs no function.

In the latch mode, in phase with (or slightly delayed with respect to) the low CK phase, the output retains the input value that was present at the time that the latch control signal was activated, regardless of subsequent changes in the input. Inverter 1 is disabled to isolate node X from the output Q, and inverter 2 of the cross coupled pair is active, so that the cross coupled pair holds on the correct value. The Sdiff_DL signal is held constant during this latch phase.

Thus, linked to the low phase of the clock CK, the multiplexer and delay element hold on to the signal information of the previous high clock phase.

The signal CKG has the same phase as input clock signal CK and the signal CKGN has the opposite phase. It is a delayed version of CK, generated internally in the multiplexer logic. The delay is greater than or equal to the delay of the XOR gate 12 and AND gate 16. This is to prevent propagation of an incorrect output arising because of the history effect of the Serror signal.

During the transparent shifting window period (CK high), a change in the data correlation information Sdiff triggered by the erroneous sampling of input signal results in generation of timing error signal Serr.

If the outputs of short combinational paths in the design change correctly due to changing inputs, then the corresponding change in Sdiff signal can also be misinterpreted as a timing error. This can be prevented by ensuring the shortest path in the design to be longer than the shifting window. For example, the insertion of extra buffers during the synthesis phase by PNR tools for the short paths.

In general, for deep pipelined microprocessors (smaller combinational path between sequential logic) this can be problematic because of the increased number of short paths. But this is of less of an issue for low power microprocessors, the microarchitectures supporting shallow pipelines.

Microprocessors with shallow pipelines relax the short path problem to a deep pipeline design, enabling a more effective deployment and viability of the error detection circuits because of the reduction in number of buffers utilized in making shorter paths longer than the shifting window. Alternatively for deep pipelined processors this can also be resolved by tuning the high phase of clock with the duty cycle control circuit.

Figure 5:
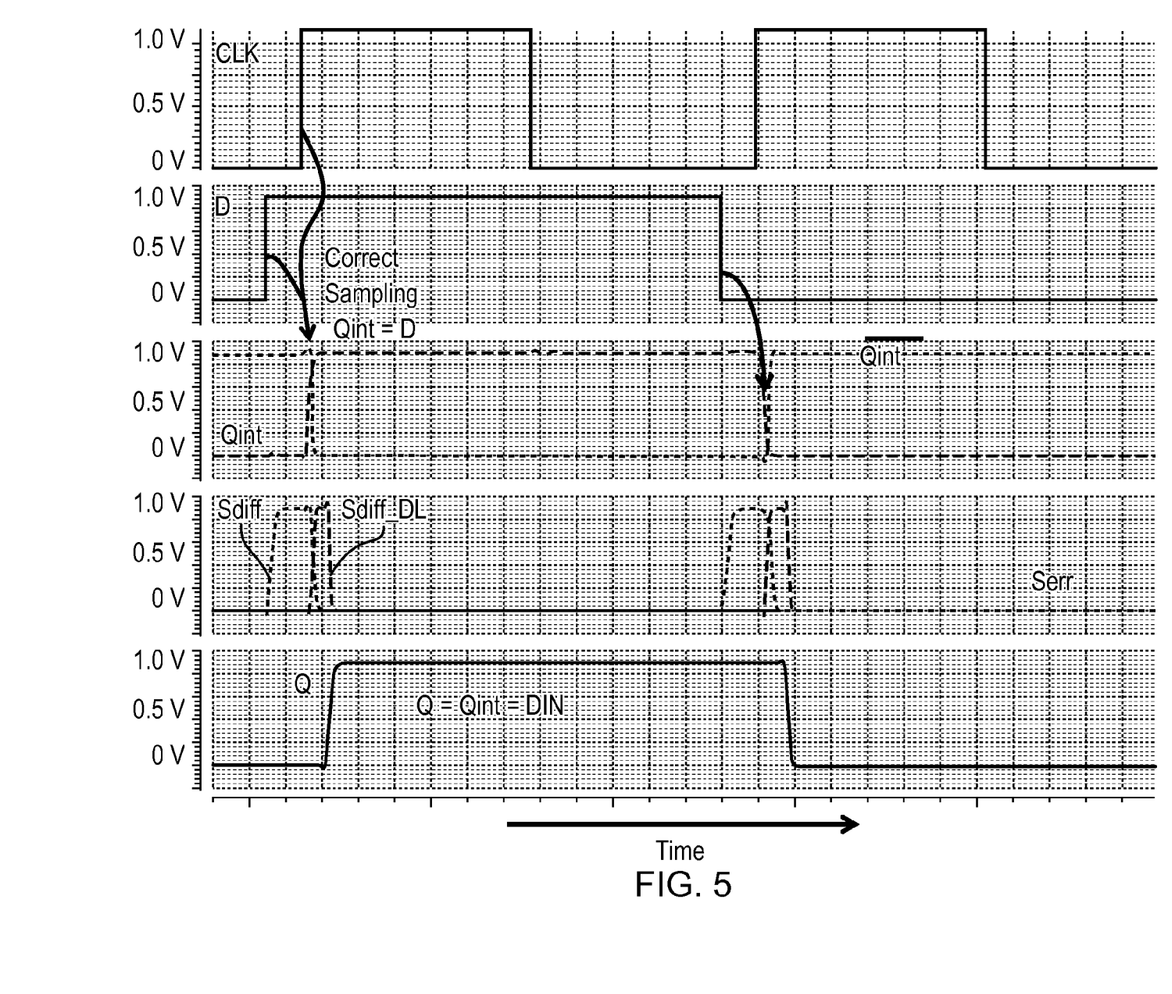
FIG. 5 shows timing diagrams to explain the operation of the circuit when there are no timing problems.

FIG. 5 shows timing waveforms for the sequential circuit when there is correct sampling case by the flip flop. In this case, the combinational data path output D is available before the rising edge of clock and therefore meets the setup time constraint of the flip flop.

The data correlation information Sdiff between the data input signal D and the data sampled in the previous cycle Qint is updated on the arrival of the D signal.

Qint is shown to be different from the D value, so that on the rising edge of the clock CK the D signal is sampled and the output Qint changes and the data correlation information Sdiff is updated.

The Sdiff signal is updated for every change in Qint and D. The first update is registered when the data D from the combinational path becomes available and the second when this combination path data gets sampled in by the flip flop.

In the data sampling time duration of the flop flop the first data correlation update Sdiff is shifted in the time domain by the delay element (Sdiff_DL).

The delay element is triggered on the rising edge of the clock and remains transparent during the entire high phase of the clock signal.

In transparent mode, (high phase of clock) the output follows the input. In the latch mode (low phase of clock), the output retains the input value that was present at the time that the latch control signal was activated, regardless of subsequent changes in the input.

Because of the correct sampling by the flip flop, Qint becomes equal to D and the Sdiff signal is disabled. This change also gets propagated through the delay element and updates the Sdiff_DL signal, as long it happens during the high phase of clock, i.e. the "shifting window". The shifting window duration determines the hold requirement for the sequential element.

The Serror signal remains low signalling no sampling error and therefore the output value (Q) is equal to the sampled output Qint as shown.

Note that FIG. 5 represents the latest arrival of the rising edge in D which will not trigger an error, so that the timing difference between CK and D is equal to the setup time.

Figure 6:
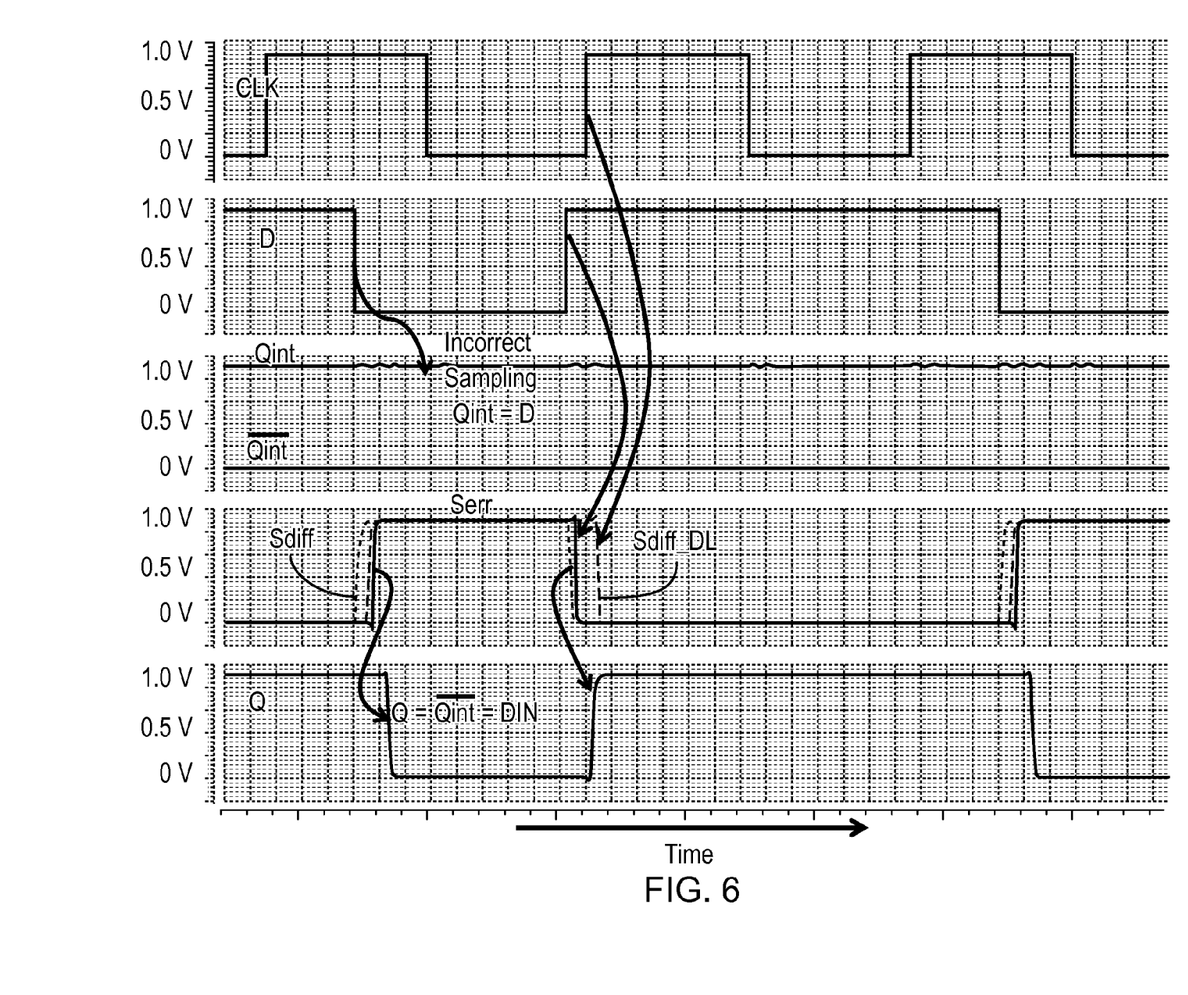
FIG. 6 shows timing diagrams to explain the operation of the circuit when there are timing problems.

FIG. 6 shows timing waveforms for the sequential circuit when the combinational data path output D arrives after the rising edge of the clock and thus violates the setup time constraint of the flip flop.

Threshold voltage mismatches, VDD lowering due to voltage drops on the VDD supply lines of the combinational path, or ageing effects can slow the data processing speed of the combinational path. The result is that the data output of combinational output arrives after the rising edge of the clock.

In FIG. 6 the transition from high to low in D happens after the rising edge of the clock CK. This results in the sampling of wrong data and the input data transition does not get sampled, so that the Qint value remains high.

In this scenario, the Sdiff signal is updated by wrongly sampled Qint data. The late arriving D signal is propagated through the delay element.

The Qint signal remains stable as it is an output of a positive edge triggered flip flop and changes only on the rising clock edge. The Sdiff signal and the delayed signal Sdiff_DL remain high. This generates the error signal Serror and the correct output is ensured by taking the inverted erroneous sampled data (Qint), as the output of sequential element.

Figure 7:
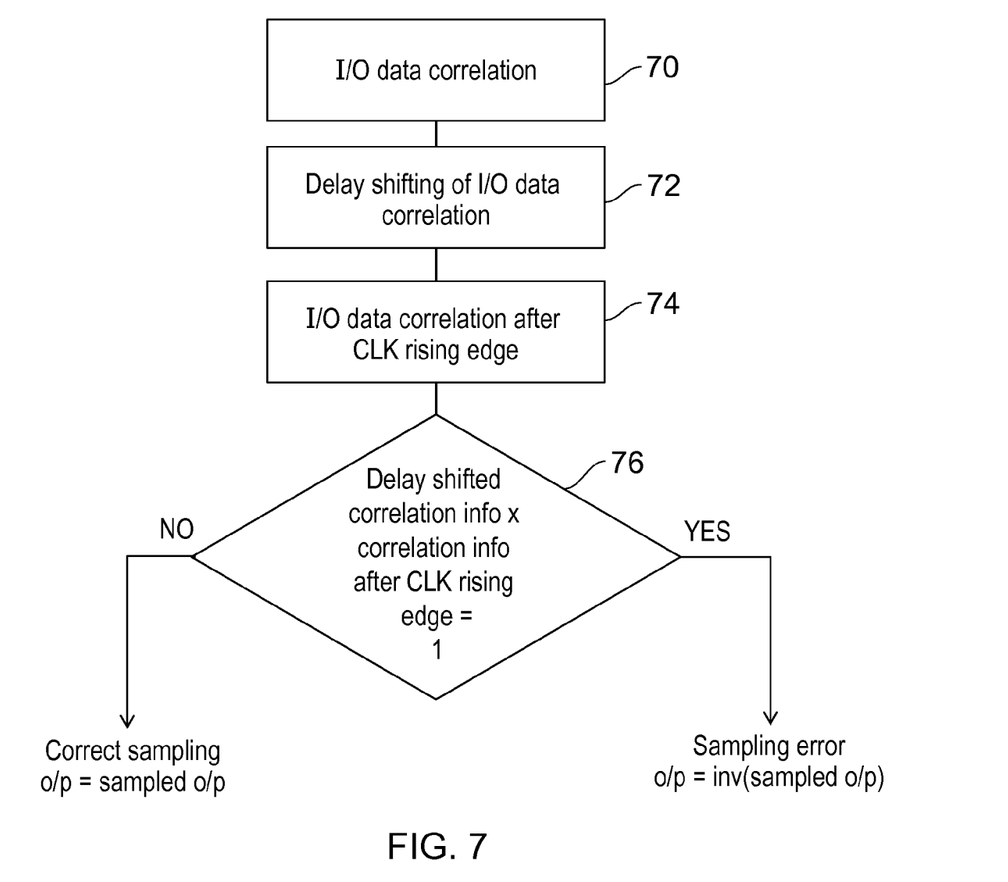
FIG. 7 is used to explain the method of the invention.

FIG. 7 shows the method underlying the approach of the invention. In step 70, there is comparison between the input and output data of the flip flop. This is the function of the XOR gate 12 to generate the Sdiff signal which involves comparing the input signal and a latched version of the input signal to derive a difference signal.

In step 72 a delayed version of the correlation signal Sdiff is generated.

Step 74 takes place after the clock rising edge, and involves obtaining an error signal from the difference signal and the delayed version of the difference signal. This represents the transparent mode.

In step 76, the latch element output or an inverted version of the latch element output in dependence on the error signal. If the correlation signal and the delay are both high, an error is detected and an inverted Qint signal is used. If no error is detected, the original signal is used.

The circuit is thus based on the detection of sampling error, in order to enable an inverted sampled data signal to be used as the signal output.

Razor flip flops on the detection of an error signal either resort to an energy expensive architecture replay, pipeline flushing or clock stalling for an error correction. The invention has an internal error correction feedback mechanism within the sequential element and there is no requirement for instruction replay or cycle stalling.

The invention can be used in a wide range of applications, such as low power and variability tolerant SoC designs.

The invention enables reduction in design margins to minimize the upsizing of logic, thereby to save silicon area and power. VDD scalability can be enhanced because of the increased resilience with the proposed sequential element.

Various other modifications will be apparent to those skilled in the art.

The invention claimed is:

1. A sequential circuit arrangement, comprising:
   a latch element clocked by a clock input signal;
   a first logic gate arrangement for comparing a latch input signal and a latched version of the input signal to derive a difference signal;
   a second logic gate arrangement for deriving an error signal from the difference signal and a delayed version of the difference signal;
   a selection unit for selecting the latch element output or an inverted version of the latch element output in dependence on the error signal.

2. An arrangement as claimed in claim 1, wherein the selection unit has a latch mode in which it holds its output at the output value at the beginning of the latch mode, the latch mode being timed based on the high or low phase of the clock input signal.

3. An arrangement as claimed in claim 1, wherein the latch element comprises a flip flop such as a D-type flip flop.

4. An arrangement as claimed in claim 1, comprising a clocked delay element for providing the delayed version of the difference signal.

5. An arrangement as claimed in claim 4, wherein the clocked delay element has a delay representing at least the path delay through the latch element and through the first logic gate arrangement.

6. An arrangement as claimed in claim 4, wherein the clocked delay element is clocked with first and second clock signals provided by the latch element, one in phase with the clock input signal and the other 180 degrees out of phase with the clock input signal.

7. An arrangement as claimed in claim 6, wherein the clocked delay element has a latch mode in which it holds its output at the value at the beginning of the latch mode, the latch mode being timed based on the high or low phase of the clock input signal.

8. An arrangement as claimed in claim 1, wherein the selection unit comprises a multiplexer with a clocked output buffer.

9. An arrangement as claimed in claim 8, wherein the multiplexer is clocked with delayed versions of first and second clock signals provided by the latch element, one in phase with the clock input signal and the other 180 degrees out of phase with the clock input signal.

10. A method of processing an input signal within a sequential circuit arrangement, the method comprising:
    latching the input signal timed with a clock input signal;
    comparing the input signal and the latched version of the input signal to derive a difference signal;
    generating a delayed version of the difference signal;
    deriving an error signal from the difference signal and the delayed version of the difference signal;
    selecting the latch element output or an inverted version of the latch element output in dependence on the error signal.

11. A method as claimed in claim 10, wherein the selecting comprises operating a multiplexer with a latch mode in which the selecting is disabled and an output is provided equal to the output value at the beginning of the latch mode, the latch mode being timed based on the high or low phase of the clock input signal.

12. A method as claimed in claim 11, comprising clocking the multiplexer with first and second clock signals provided by the latch element, one in phase with the clock input signal and the other 180 degrees out of phase with the clock input signal.

13. A method as claimed in claim 10, wherein generating the delayed version comprises operating a clocked delay element which has a delay representing the path delay through the latch element and through the first logic gate arrangement.

14. A method as claimed in claim 10, comprising clocking the delay element with first and second clock signals provided by the latch element, one in phase with the clock input signal and the other 180 degrees out of phase with the clock input signal.

15. A method as claimed in claim 14, wherein generating the delayed version comprises operating the clocked delay element with latch mode in which the delay function is disabled and an output is provided equal to the output value at the beginning of the latch mode, the latch mode being timed based on the high or low phase of the clock input signal.

* * * * *